(12) United States Patent
Kobayashi et al.

(10) Patent No.: US 9,318,519 B2
(45) Date of Patent: Apr. 19, 2016

(54) IMAGING APPARATUS AND IMAGING SYSTEM

(71) Applicant: CANON KABUSHIKI KAISHA, Tokyo (JP)

(72) Inventors: Masahiro Kobayashi, Tokyo (JP); Yoichi Wada, Yokohama-shi (JP); Akira Okita, Yamato-shi (JP); Yu Arishima, Yokohama-shi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 151 days.

(21) Appl. No.: 14/259,655

(22) Filed: Apr. 23, 2014

(65) Prior Publication Data

US 2014/0320690 A1 Oct. 30, 2014

(30) Foreign Application Priority Data

Apr. 26, 2013 (JP) .................................. 2013-093885

(51) Int. Cl.
| | |
|---|---|
| H04N 5/225 | (2006.01) |
| H01L 27/146 | (2006.01) |
| H04N 5/232 | (2006.01) |
| H04N 5/378 | (2011.01) |

(52) U.S. Cl.
CPC .... H01L 27/14609 (2013.01); H01L 27/14603 (2013.01); H01L 27/14641 (2013.01); H04N 5/23212 (2013.01); H04N 5/378 (2013.01)

(58) Field of Classification Search
None
See application file for complete search history.

(56) References Cited

U.S. PATENT DOCUMENTS

| | | | | | |
|---|---|---|---|---|---|
| 5,587,738 A | * | 12/1996 | Shinohara | ............. | H04N 5/3592 348/301 |
| 6,107,655 A | * | 8/2000 | Guidash | ............. | H01L 27/14603 257/233 |
| 6,933,978 B1 | * | 8/2005 | Suda | ............. | G02B 7/34 348/345 |
| 7,227,208 B2 | * | 6/2007 | Ogura | ............. | H01L 27/14603 257/233 |
| 7,638,826 B2 | * | 12/2009 | Hiyama | ............. | H01L 27/14603 257/291 |
| 8,773,560 B2 | * | 7/2014 | Okita | ............. | H04N 5/335 250/208.1 |
| 2002/0024068 A1 | * | 2/2002 | Shinohara | ............. | H04N 3/155 257/225 |
| 2004/0080645 A1 | * | 4/2004 | Shinohara | ............. | H04N 3/155 348/301 |
| 2005/0205902 A1 | | 9/2005 | Hara | | |

FOREIGN PATENT DOCUMENTS

| | | |
|---|---|---|
| JP | 2001-124984 A | 5/2001 |
| JP | 2004-134867 A | 4/2004 |
| JP | 2012023389 A | 2/2012 |
| WO | 2014013696 A1 | 1/2014 |

* cited by examiner

*Primary Examiner* — Twyler Haskins
*Assistant Examiner* — Dwight C Tejano
(74) *Attorney, Agent, or Firm* — Canon USA, Inc. IP Division

(57) ABSTRACT

One embodiment according to the present invention is an imaging apparatus including a pixel. The pixel includes first and second photoelectric conversion units, a floating diffusion portion, and first and second transfer transistors. The first and second transfer transistors are configured to transfer electric carriers generated respectively at the first and second photoelectric conversion units to the floating diffusion portion. The imaging apparatus includes a first conductive member electrically connected to the gate electrode of the first transfer transistor, a second conductive member electrically connected to the gate electrode of the second transfer transistor, and a control unit. The distance of closest proximity between the first conductive member and the floating diffusion portion is longer than the distance of closest proximity between the second conductive member and the floating diffusion portion.

21 Claims, 11 Drawing Sheets

IMAGING APPARATUS AND IMAGING SYSTEM

BACKGROUND OF THE INVENTION

1. Field of the Invention

The present invention relates to an imaging apparatus and an imaging system.

2. Description of the Related Art

An imaging apparatus configured to perform both of focus detection and imaging has been proposed. According to Japanese Patent Laid-Open No. 2001-124984, one pixel of the imaging apparatus includes a photoelectric conversion unit A and a photoelectric conversion unit B. Each of the photoelectric conversion units is disposed so as to be conjugate with the pupil of the lens. At the time of focus detection, a signal is read out individually from each of the photoelectric conversion units A and B of multiple pixels, and two images according to light beams transmitted through mutually different positions of the pupil of the lens are generated. Also, a photographic subject image may be obtained (imaged) by adding the signals from the two photoelectric conversion units.

Also, Japanese Patent Laid-Open No. 2004-134867 discloses an imaging apparatus with a configuration having one common amplifier for multiple pixels. It has been disclosed in such an imaging apparatus to output signals corresponding to electric carriers accumulated in photodiodes in a first row, and signals corresponding to added signals of the electric carriers accumulated in the photodiodes in the first and second rows.

SUMMARY OF THE INVENTION

According to a first aspect, the present invention provides an imaging apparatus including a pixel. The pixel includes at least a first photoelectric conversion unit, a second photoelectric conversion unit, a floating diffusion portion, a first transfer transistor and a second transfer transistor. The first transfer transistor transfers an electric carrier generated at the first photoelectric conversion unit to the floating diffusion portion. The second transfer transistor transfers an electric carrier generated at the second photoelectric conversion unit to the floating diffusion portion. A first conductive member is electrically connected to a gate electrode of the first transfer transistor. A second conductive member is electrically connected to a gate electrode of the second transfer transistor. A control unit is electrically connected to the first transfer transistor and the second transfer transistor via the first conductive member and the second conductive member respectively. The distance of closest proximity between the first conductive member and the floating diffusion portion is longer than the distance of closest proximity between the second conductive member and the floating diffusion portion. The control unit performs a first control operation for setting from a state in which both of the first transfer transistor and the second transfer transistor are off, a state where only the first transistor is on, while keeping the second transfer transistor off. And the control unit performs a second control operation for setting a state in which both the first transfer transistor and the second transfer transistor are on.

Further features of the present invention will become apparent from the following description of exemplary embodiments with reference to the attached drawings.

DESCRIPTION OF THE EMBODIMENTS

There has been demand for an imaging apparatus to read out signals at higher speed. The present inventor and others have found that an imaging apparatus configured to perform both of focus detection and imaging by performing readout of signals corresponding to the layout of pixels, is capable of reading out signals at higher speed.

Some embodiments according to the present invention enable an imaging apparatus to read signals at higher speed.

Figure 3:
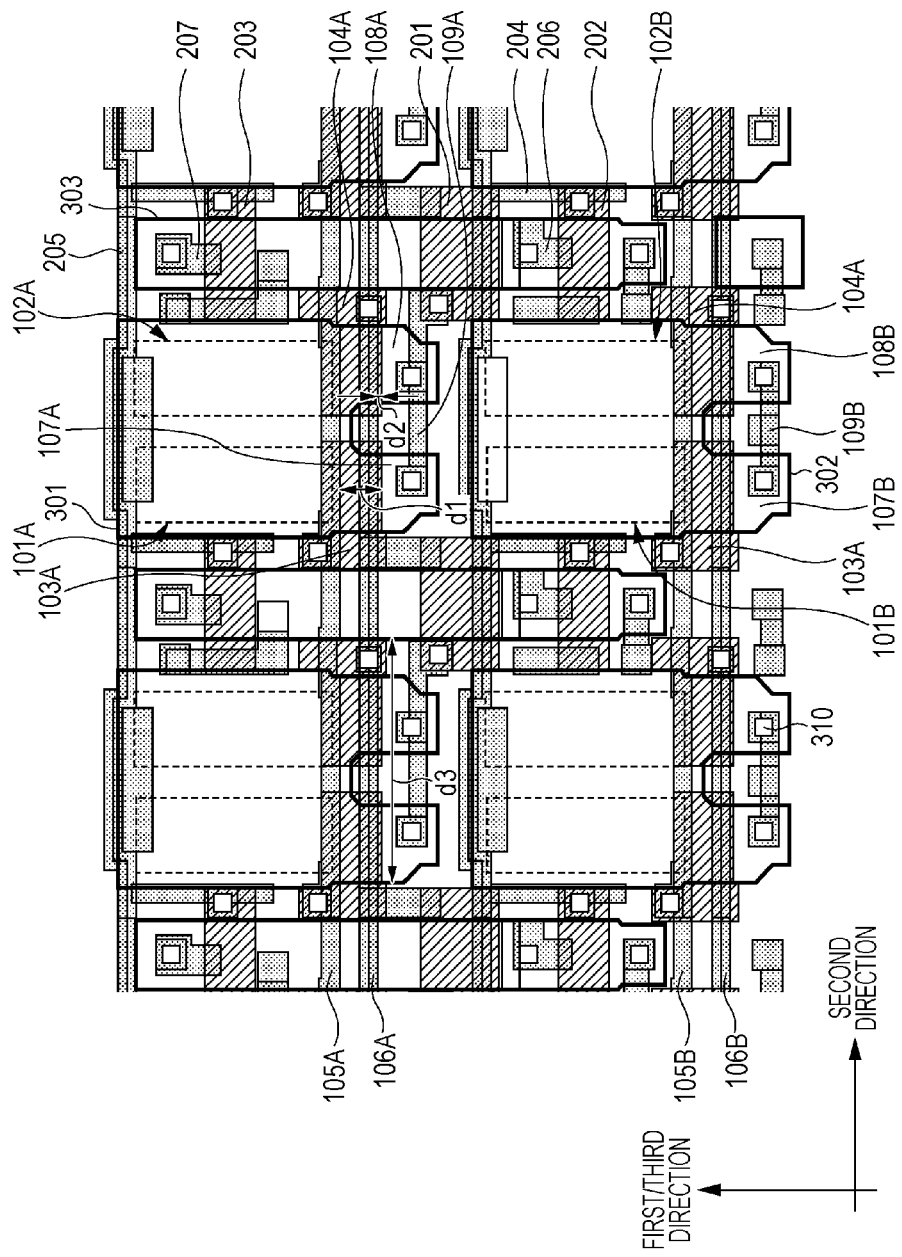
FIG. 3 is a diagram schematically illustrating a planar structure of the imaging apparatus.

An imaging apparatus according to one embodiment of the present invention will be described. A pixel included in the imaging apparatus includes a first photoelectric conversion unit, a second photoelectric conversion unit, a first transfer transistor, a second transfer transistor, and a floating diffusion portion (hereinafter, referred to as FD portion). The first transfer transistor transfers electric carriers generated at the first photoelectric conversion unit to the FD portion. The second transfer transistor transfers electric carriers generated at the second photoelectric conversion unit to the FD portion. Note that FIG. 3 illustrates a first photoelectric conversion unit 101A, a second photoelectric conversion unit 102A, the gate electrode of the first transfer transistor 103A, and the gate electrode of the second transfer transistor 104A.

The first and second photoelectric conversion units are disposed so as to be conjugate with the pupil of the lens. The first and second photoelectric conversion units receive light beams transmitted through mutually different positions of the pupil of the lens. This configuration enables focus detection. Note that the use of the imaging apparatus for performing focus detection is one of multiple embodiments. In other embodiments of the present invention, operation for reading out individual signals and an added signal from the two photoelectric conversion units may be performed for another usage.

The FD portion includes, for example, a semiconductor region having a conductivity type corresponding to the polarity of a signal carrier (hereinafter, referred to as FD region), and a conductive member electrically connected to the FD region. The FD portion constitutes the input node of an amplifying portion of the pixel in some embodiments of the present invention. That is to say, these embodiments are pixel amplifying type imaging apparatuses (Active Pixel Sensor (APS)). In this case, the FD portion may include the gate electrode of an amplifying transistor. Also, in some embodiments, the FD portion includes multiple FD regions corresponding to multiple photoelectric conversion units, and a conductive member mutually connecting the FD regions. The FD portion may include a contact plug configured to electrically connect the semiconductor region and the conductive member. Note that FD regions 107A and 108A, and a conductive member 109A mutually connecting the FD regions 107A and 108A, which constitute the FD portion, are exemplified in FIG. 3.

A conductive member configured to supply a control signal is electrically connected to the gate of each of the transfer transistors. The conductive member is used to constitutes, or make up, a wiring layer disposed on a semiconductor substrate. The conductive member and the semiconductor region or gate electrode are electrically connected via a contact plug. Also, the conductive members disposed on different wiring layers are electrically connected to each other via the contact plug. The contact plug may be formed of a material different from the conductive member. Also, the conductive member and contact plug may be configured of the same material, such as a case where the conductive member and contact plug are formed by the dual damascene method, or the like.

The gate electrodes of the transfer transistors, and the conductive member electrically connected thereto are distinguished based on the common general technical knowledge in the semiconductor field. For example, the gate electrodes and the conductive member electrically connected to thereto are distinguished by difference in the materials of both. Specifically, the transfer transistors include a gate electrode formed of polysilicon. The conductive member formed of aluminum, an aluminum alloy, copper, a copper alloy, or the like, is electrically connected to this gate electrode. The conductive member is electrically connected to the gate electrode via the contact plug made of tungsten or the like.

Alternatively, the gate electrode, and the conductive member electrically connected thereto are distinguished by difference in formation processes. Normally, after a process for forming a gate electrode, an insulating layer is formed on this gate electrode. Next, an opening is formed in the insulating layer, and a contact plug to be electrically connected to the gate electrode is formed therein. Thereafter, a conductive member to be electrically connected to the gate electrode is formed.

In the case of embodiments according to the present invention, the conductive member electrically connected to the second transfer transistor (hereinafter, referred to as second conductive member) is disposed closer to the FD portion than the conductive member electrically connected to the first transfer transistor (hereinafter, referred to as first conductive member).

For example, distance d1 from the first conductive member to the FD portion is longer than distance d2 from the second conductive member to the FD portion in some embodiments. Here, the distance from a conductive member to the FD portion is distance where the conductive member electrically connected to the gate of the transfer transistor, and the semiconductor region or conductive member included in the FD portion are in closest proximity to each other. Such distance is exemplified by the arrows d1 and d2 in FIG. 3. Note that ends of the FD region are defined by a PN junction surface and a boundary surface between the FD region and another material.

Also, the first conductive member and the second conductive member are disposed on the same wiring layer in some other embodiments. At least a part of an orthogonal projection of the second conductive member onto a predetermined plane is positioned in a region between an orthogonal projection of the first conductive member onto this predetermined plane, and an orthogonal projection of the semiconductor region included in the FD portion onto this predetermined plane. The predetermined plane is, for example, an interface between the semiconductor region included in the first photoelectric conversion unit and an insulating film disposed on the first photoelectric conversion unit, that is, a plane parallel with the surface of the first photoelectric conversion unit. Also, the same wiring layer is a group of conductive members disposed in generally the equal height from the surface of the photoelectric conversion unit. Generally, conductive members included in the same wiring layer are formed in the same process.

Also, the first conductive member, second conductive member, and conductive member included in the FD portion are disposed on the same wiring layer in some other embodiments. Further, at least one portion of the second conductive member is positioned between the first conductive member, and the conductive member included in the FD portion.

In the above described configuration, first, the electric carrier of the first photoelectric conversion unit is transferred to the FD portion. Next, both of the transfer transistors corresponding to the first and second photoelectric conversion units respectively are turned on in parallel with each other. According to such operation, the electric carrier of the first photoelectric conversion unit, and the electric carrier of the second photoelectric conversion unit are added at the FD portion. Note that turning on the two transfer transistors in parallel with each other, or setting the two transfer transistors being on in parallel with each other, means that there is a period when both of the two transfer transistors are in an 'on' state. Timings for the two transfer transistors making the transition from off to on are not necessarily the same, and they may be different. Also, timings for the two transfer transistors making the transition from on to off are not necessarily the same, and they may be different. Similarly, turning off the two transfer transistors in parallel with each other, or setting the two transfer transistors being off in parallel with each other, means that there is a period when both of the two transfer transistors are in an 'off' state.

Specifically, the imaging apparatuses according to some embodiments include a control unit configured to control the transfer transistors to be turned on or off. The control unit performs first control operation for turning on the first transfer transistor from a state in which both of the first and second transfer transistors are off, while keeping the second transfer transistor off. Thus, the control unit transfers an electric carrier generated at the first photoelectric conversion unit to the FD portion. The control unit performs second control operation for turning on the first and second transfer transistors in parallel with each other while the electric carrier transferred by the first control operation is being held at the FD portion. Thus, the control unit adds the electric carrier generated at the first photoelectric conversion unit and the electric carrier generated at the second photoelectric conversion unit at the FD portion.

The control unit is configured as a circuit such as a shift register or decoder or the like, for example. In this case, a control operation means to output a driving pulse such as turning on or off each transfer transistor. In addition to this, various types of circuit capable of controlling the transfer transistors may be employed as the control unit.

According to the above operation, a first signal based on electric carriers from either one of two photoelectric conversion units is read out, and thereafter an added signal which is based on a sum of electric carriers from the two photoelectric conversion units is read out. Also, by performing differential processing between the first signal, and the added signal which is read out after the first signal, a second signal based on electric carriers of the other photoelectric conversion unit can be obtained.

Some embodiments according to the present invention enable signals to be read out at high speed. An advantage of this high-speed signal readout will be described.

In general, when the potential of the gate of a transfer transistor changes from a level corresponding to off to a level corresponding to on, the potential of the FD portion may be changed by capacitive coupling between the conductive member electrically connected to the gate of the transfer transistor, and the FD portion. Thus, readout of a signal based on the transferred electric carrier is performed after change in the potential of the FD portion sufficiently converges, that is, after the potential of the FD portion is stabilized, thereby enabling signal accuracy to be improved. However, when the change in the potential of the FD portion is great, it takes time until the potential of the FD portion is stabilized. Accordingly, it takes a longer time to read out an accurate signal.

As described above, a signal based on the electric carrier of one of the two photoelectric conversion units is read out in an embodiment of the present invention. Therefore, control for changing the other transfer transistor from off to on is performed while keeping one of the two transfer transistors off.

Here, the first conductive member is disposed farther from the FD portion than the second conductive member in an embodiment according to the present invention. Specifically, coupling capacitance between the first conductive member and the FD portion is smaller than coupling capacitance between the second conductive member and the FD portion. Accordingly, change in the potential of the FD portion when the first transfer transistor turns on is smaller than change in the potential of the FD portion when the second transfer transistor turns on.

Therefore, the first transfer transistor of which the gate is connected to the conductive member disposed in a position far away from the FD portion is on while keeping the second transfer transistor off in an embodiment of the present invention. Thus, change in the potential of the FD portion can be reduced. Consequently, a period from transfer of an electric carrier until readout of a signal can be reduced, and the signal can be read out at high speed.

Hereinafter, embodiments of the present invention will be described in detail with reference to the appended drawing. The present invention is not restricted to embodiments alone that will be described below. Also, examples in which a partial configuration of one of the following embodiments is added to another embodiment or replaced with a partial configuration of another embodiment are also embodiments of the present invention.

First Embodiment

Figure 1:
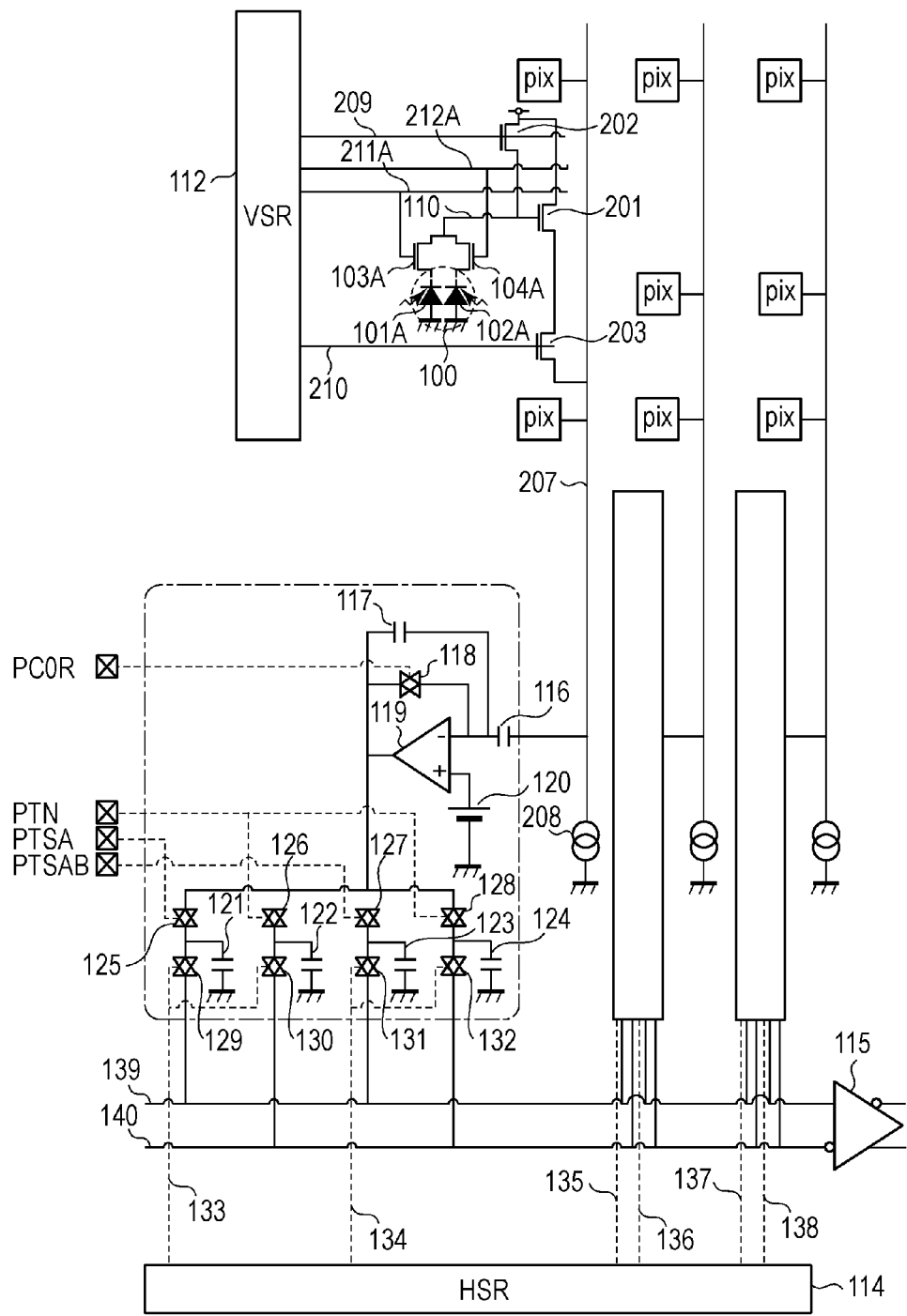
FIG. 1 is a diagram illustrating an equivalent circuit of an imaging apparatus.

FIG. 1 is an equivalent circuit diagram of an imaging apparatus according to the present embodiment. A pixel 100 includes multiple photoelectric conversion units, and here includes a first photoelectric conversion unit 101A and a second photoelectric conversion unit 102A. Photodiodes may be employed as the photoelectric conversion units.

Transfer transistors 103A and 104A are provided corresponding to each of the multiple photoelectric conversion units, and are configured to transfer a signal of the corresponding photoelectric conversion unit to an FD portion 110. The FD portion 110 is the input node of an amplifying transistor.

An amplifying transistor 201 amplifies a signal transferred to the FD portion 110 to output to an output line 207. A MOS transistor may be employed as the amplifying transistor 201.

A reset transistor 202 supplies reset voltage to the input node of the amplifying transistor 201. A selection transistor 203 controls electrical connection between the amplifying transistor 201 and the output line 207.

A current source 208 is electrically connected to the output line 207. The current source 208 supplies bias current to the amplifying transistor 201. The amplifying transistor 201 and current source 208 make up source follower.

A driving line 211A, driving line 212A, driving line 209, and driving line 210 are connected to the gates of the first transfer transistor 103A, second transfer transistor 104A, reset transistor 202, and selection transistor 203, respectively. A driving pulse from a vertical scanning circuit 112 is supplied to each of the gates for each row or sequentially or randomly. The vertical scanning circuit 112 serves as a control unit in the present embodiment.

A column circuit 113 receives a signal from the output line 207. The column circuit 113 is connected to the output line 207 directly or via a switch. Signals processed at the column circuit 113 are sequentially output to an output amplifier 115 by a horizontal scanning circuit 114, and externally output.

Principal operation of the column circuit 113 is to inversely amplify the signal of the output line 207 using gain determined by the capacitance value of an input capacitor 116 and the capacitance value of a feedback capacitor 117. Further, the column circuit 113 may perform virtually grounded operation, and may also perform correlation double sampling (CDS) by clamping operation using the input capacitor 116.

Next, an example of a specific circuit of the column circuit 113 will be described. The first node of the input capacitor 116 is electrically connected to the output line 207 at the first node, and the second node thereof is electrically connected to an inverting input node of an operation amplifier 119. The first node of the feedback capacitor 117 is electrically connected to the inverting input node of the operation amplifier 119 and the second node of the input capacitor 116. The second node of the feedback capacitor 117 is electrically connected to the output node of the operation amplifier 119.

A switch 118 is provided to a feedback path between the inverting input node and output node of the operation amplifier 119 to control electric connection of both. The feedback capacitor 117 and switch 118 are provided in parallel.

A power source 120 supplies reference voltage Vref to a non-inverting input node of the operation amplifier 119. Holding capacitors 121 to 124 are capacitors holding output from the operation amplifier 119. Switches 125 to 128 are provided to an electric path between the holding capacitors 121 to 124 and the operation amplifier 119, and control electric conductivity between the output node of the operation amplifier 119 and the holding capacitors 121 to 124. Switches 129 to 132 receive a signal from the horizontal scanning circuit 114 and output the signals held at the holding capacitors 121 to 124 to horizontal output lines 139 and 140. The output amplifier 115 takes difference between signals output to the horizontal output lines 139 and 140, and externally outputs the difference.

A driving pulse PC0R is supplied to the switch 118. A driving pulse PTN is supplied to the switches 126 and 128. A driving pulse PISA is supplied to the switch 125. A driving pulse PTSAB is supplied to a switch 127.

Figure 2:
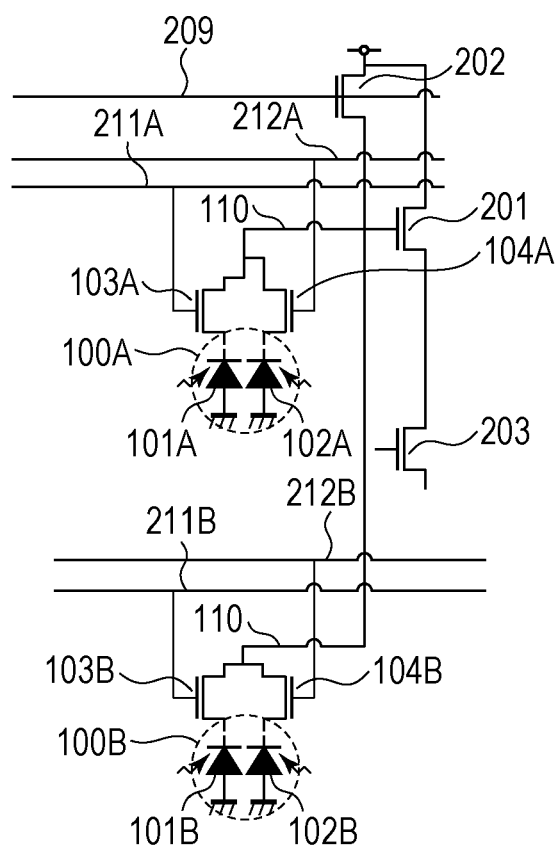
FIG. 2 is a diagram illustrating an equivalent circuit of an imaging apparatus.

The amplifying transistor 201 is included in each of the multiple pixels 100 in FIG. 1. As illustrated in FIG. 2, the multiple pixels 100A and 100B may share the single amplifying transistor 201. In FIG. 2, portions having the same functions as those in FIG. 1 are denoted with the same reference numerals. An alphabetic letter appended to the end of a reference numeral indicates that this portion is included in a different pixel.

The imaging apparatus illustrated in FIG. 2 includes a first pixel 100A including photoelectric conversion units 101A and 102A, and a second pixel 100B including photoelectric conversion units 101B and 102B. Light condensed by a first micro lens is input to the multiple photoelectric conversion units included in the first pixel 100A, and light condensed by a second micro lens is input to the multiple photoelectric conversion units included in the second pixel 100B.

Transfer transistors 103A, 104A, 103B, and 104B are disposed corresponding to the photoelectric conversion units 101A, 102A, 101B, and 102B, respectively. Driving lines 211A, 212A, 211B, and 212B are disposed as lines for supplying a driving pulse to the transfer transistors 103A, 104A, 103B, and 104B, respectively.

According to such a configuration, multiple pixels for imaging may share the amplifying transistor 201, reset transistor 202, and selection transistor 203. Thus, the number of transistors per one pixel may be reduced. Consequently, the areas of the photoelectric conversion units may be expanded.

Next, a planar structure of the imaging apparatus according to the present embodiment will be described. FIG. 3 is a diagram schematically illustrating the planar structure of the imaging apparatus illustrated in FIG. 2. Portions corresponding to the devices illustrated in FIG. 2 are denoted with the same reference numerals as with FIG. 2.

The imaging apparatus is formed on a semiconductor substrate such as a silicon substrate, for example. The semiconductor substrate includes multiple active regions. The two photoelectric conversion units 101A and 102A included in the first pixel 100A are disposed in a first active region 301. Also, the two photoelectric conversion units 101B and 102B included in the second pixel 100B are disposed in a second active region 302 different from the first active region 301. The photoelectric conversion units include an N-type semiconductor region configured to accumulate a signal electric carrier.

A first FD region 107A and a second FD region 108A are disposed in the first active region 301. The electric carrier of the first photoelectric conversion unit 101A is transferred to the first FD region 107A. The electric carrier of the second photoelectric conversion unit 102A is transferred to the second FD region 108A. The two FD regions 107A and 108A are electrically connected to each other by a contact plug and a conductive member 109A. The first FD region 107A, second FD region 108A, and conductive member 109A make up the FD portion 110. Note that the shape denoted by reference numeral 310 illustrates the contact plug. Similar figures are all contact plugs. However, for simplification of FIG. 3, the reference numerals of the other contact plugs are omitted. This is also true in other drawings.

The gate electrodes of the transistors in FIG. 3 are denoted with the same reference numerals as the corresponding devices illustrated in FIG. 2. For example, the gate electrode 103A makes up the gate of the first transfer transistor 103A in FIG. 2. This is also true regarding the other gate electrodes.

As illustrated in FIG. 3, the gate electrode 103A is disposed between the first photoelectric conversion unit 101A and the FD region 107A in a plane view. Also, the gate electrode 104A is disposed between the second photoelectric conversion unit 102A and the FD region 108A in a plane view.

The amplifying transistor 201, reset transistor 202, and selection transistor 203 are disposed in a third active region 303 different from the active regions 301 and 302 where the photoelectric conversion units are disposed. These transistors share a source region and a drain region with another transistor. The drain region shared by the amplifying transistor 201 and reset transistor 202 is electrically connected to a conductive material 206 configured to supply power voltage, via a contact plug. Also, the source region of the selection transistor 203 is electrically connected to a conductive member making up the output line 207 via a contact plug.

Also, the FD portion 110 is electrically connected to the gate electrode of the amplifying transistor 201 via a contact plug. Specifically, the conductive member 109A configured to mutually electrically connect the two FD regions 107A and 108A is electrically connected to the gate electrode of the amplifying transistor 201 via a contact plug. Note that the FD regions 107B and 108B corresponding to the second pixel 100B are also electrically connected to the gate electrode of the amplifying transistor 201 via a conductive member which is not illustrated and a contact plug.

The gate electrode of the first transfer transistor 103A is electrically connected to a conductive member 105A making up the corresponding driving line 211A via a contact plug. The gate electrode of the second transfer transistor 104A is electrically connected to a conductive member 106A making up the corresponding driving line 212A via a contact plug. The gate electrode of the reset transistor 202 is electrically connected to a conductive member 204 making up the corresponding driving line 209 via a contact plug. The gate electrode of the selection transistor 203 is electrically connected to a conductive member 205 making up the corresponding driving line 210 via a contact plug.

The conductive members 105A, 106A, 109A, 105B, 106B, 109B, 204, and 205 are disposed in the same wiring layer in the present embodiment. It goes without say that one of these conductive members may be disposed in another wiring layer. Also, conductive members making up the output line 207, a power supply line, a GND line, a light shielding line, and so forth are included in a wiring layer not illustrated in FIG. 3.

Note that a lens array (not illustrated) including multiple lenses disposed corresponding to the multiple pixels respectively is disposed on the upper portions of the photoelectric conversion units. A single lens in the lens array condenses light on the multiple photoelectric conversion units in the same pixel. The multiple photoelectric conversion units included in each pixel are disposed in a different position in a plane view.

Now, feature points in the present embodiment will be described. As illustrated in FIG. 3, the first conductive member 105A electrically connected to the gate electrode of the first transfer transistor 103A is disposed farther than the second conductive member 106A electrically connected to the gate electrode of the second transfer transistor 104A from the FD portion 110. In other words, distance d1 of a portion where the first conductive member 105A and the FD portion 110 are in closest proximity to each other is longer than distance d2 of a portion where the second conductive member 106A and the FD portion 110 are in closest proximity to each other. In the case that the FD portion 110 includes the semiconductor region (FD region) as with the present embodiment, there are the following cases as a portion where both are in closest proximity to each other. A first case is where distance d1 from the first conductive member 105A to the FD region 107A is longer than distance d2 from the second conductive member 106A to the FD region 108A. A second case is where distance d1 from the first conductive member 105A to the conductive member 109A is shorter than distance d2 from the second conductive member 106A to the conductive member 109A.

Also, according to another aspect, the first conductive member 105A and second conductive member 106A are disposed on the same wiring layer. At least one portion of an orthogonal projection of the second conductive member 106A as to a predetermined plane is positioned between an orthogonal projection of the first conductive member 105A as to this predetermined plane, and an orthogonal projection of the FD region 107A or 108A included in the FD portion 110 as to this predetermined plane. The predetermined plane is, for example, an interface between a semiconductor region included in the first photoelectric conversion unit 101A and an insulating film disposed on the first photoelectric conversion unit 101A, that is, a plane parallel to the surface of the first photoelectric conversion unit 101.

Further, according to another aspect, the first conductive member 105A, second conductive member 106A, and conductive member 109A included in the FD portion 110 are disposed on the same wiring layer. At least one portion of the second conductive member 106A is positioned between the first conductive member 105A and the conductive member 109A included in the FD portion 110.

According to such a configuration, capacitive components between the first conductive member 105A and FD portion 110 are smaller than capacitive components between the second conductive member 106A and FD portion 110. Specifically, in the case of the present embodiment, distance d3 where the conductive members 105A and 106A, and the FD portion 110 run in parallel is about 2.4 micrometer, and a wiring interval between the first conductive members 105A and 106A is about 0.3 micrometer. In this case, the capacitive components between the first conductive member 105A and FD portion 110 are around a half of the capacitive components between the second conductive member 106A and FD portion 110. Also, the total of capacitive components between the first and second conductive members 105A and 106A is about 20% of the entire capacitance of the FD portion 110. Note that the above numeric values are just an example, and may be modified as appropriate.

Note that the present embodiment has the following secondary features. As a first feature, the first photoelectric conversion unit 101A, the gate electrode of the first transfer transistor 103A, and the first FD region 107A are arrayed in a first direction. The second photoelectric conversion unit 102A, the gate electrode of the second transfer transistor 104A, and the second semiconductor region 108A are arrayed in the first direction. On the other hand, each of the first conductive member 105A and second conductive member 106A extends in a direction crossing the first direction (second direction in FIG. 3). According to such a layout, the driving lines of the transfer transistors may effectively be disposed, and accordingly, openings on the photoelectric conversion units may be increased. Consequently, sensitivity may be improved according to the present embodiment.

Also, as a second feature of the secondary features of the present embodiment, an orthogonal projection of the gate electrode of the first transfer transistor 103A as to a predetermined plane is partially overlapped with at least each of orthogonal projections of the first conductive member 105A and second conductive member 106A as to this predetermined plane. Also, an orthogonal projection of the gate electrode of the second transfer transistor 104A as to a predetermined plane is partially overlapped with at least each of orthogonal projections of the first conductive member 105A and second conductive member 106A as to this predetermined plane. According to such a layout, the driving lines of the transfer transistors may effectively be disposed, and accordingly, openings in the photoelectric conversion units may be expanded. Consequently, sensitivity may be improved according to the present embodiment.

Figure 4:
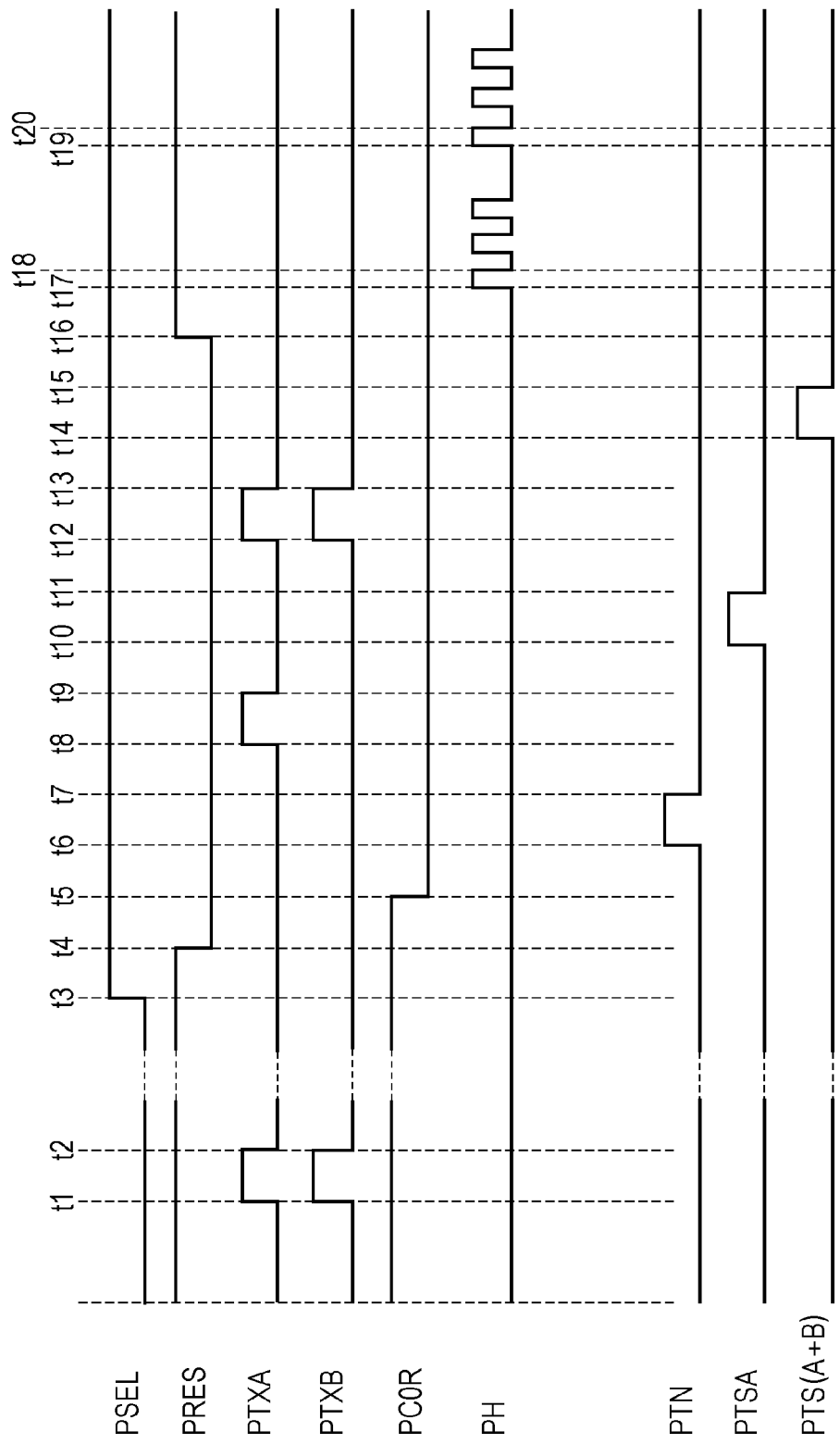
FIG. 4 is a diagram illustrating driving timing of the imaging apparatus.

Next, driving of the imaging apparatus according to the present embodiment will be described with reference to the driving pulses illustrated in FIG. 4. Now, operation of the imaging apparatus illustrated in FIG. 1 will be described. Regarding any of the driving pulses, the corresponding transistor is turned on by a high-level pulse, and the corresponding transistor is turned off by a low-level pulse.

First, at time T=t1, driving pulses PTXA and PTXB to be supplied to the driving lines 211A and 212A go to a high level. At this time, since a driving pulse PRES to be supplied to the driving line 209 is in a high level, the photoelectric conversion units 101A and 102A are reset.

Next, at T=t2, the driving pulses PTXA and PTXB go to a low level. At this time, an electric carrier accumulation period is started at the photoelectric conversion units 101A and 102A. Since the driving pulse PRES is kept in a high level, the reset operation of the FD portion 110 which is the input node of the amplifying transistor 201 continues. After accumulation is performed for a predetermined period, readout of signals to the output line 207 is sequentially performed for each row or for every certain multiple rows.

At time T=t3, the driving pulse PSEL to be supplied to the driving line 210 of the selection transistor 203 goes to a high level to turn on the selection transistor 203. Thus, the potential of the FD portion 110, that is, a signal corresponding to the potential of the input node of the amplifying transistor 201 is output to the output line 207. At this time, the signal based on a state in which the FD portion 110 is reset (reset signal level) is output.

At time T=t4, the driving pulse PRES to be supplied to the driving line 209 of the reset transistor 202 is turned to a low level, thereby releasing the reset operation of the input node of the amplifying transistor 201. Next, the reset signal level is read out to the output line 207, and is input to the column circuit 113. At this time, the operation amplifier 119 of the column circuit 113 is in a virtually grounded state. Specifically, the driving pulse PCOR goes to a high level, and the switch 118 is in a conductive state. The operation amplifier 119 is in a state for buffering output of the Vref, and the reset signal level is supplied to the input capacitor 116 in this state.

Next, at T=t5, the driving pulse PCOR is turned to a low level, and at T=t6, the driving pulse PTN is switched from a low level to a high level to turn on the switches 126 and 128. At T=t7, the driving pulse PTN is switched from a high level to a low level to turn off the switches 126 and 128. According to this operation, the output of approximate Vref is supplied to the holding capacitors 122 and 124, following which the holding capacitors 122 and 124, and the output node of the operation amplifier 119 goes to a non-conductive state.

Subsequently, at T=t8, the driving pulse PTXA is turned to a high level, the electric carrier of the first photoelectric conversion unit 101A is transferred to the FD portion 110, and at T=t9, the driving pulse PTXA is turned to a low level. According to this operation, the electric carrier of the photoelectric conversion unit 101A is transferred to the FD portion 110. Thus, a signal based on the electric carrier generated at the first photoelectric conversion unit 101A is supplied to the column circuit 113 via the amplifying transistor 201 and output line 207. According to the above operation, a signal for focus detection may be generated at the output line 207.

Note that, during from the time T=t8 to the time T=t9, since the driving pulse PTXB is in a low level, the second transfer transistor 104A is kept off. Specifically, at time T=t8, from a state in which both of the first and second transfer transistors 103A and 104A are in an off state, the first transfer transistor 103A is turned on while keeping the second transfer transistor 104A off.

A value obtained by multiplying change in voltage by inverting gain with a ratio between the capacitance value C0 of the input capacitor 116, and the capacitance value Cf of the feedback capacitor 117 is output at the column circuit 113. Specifically, if we say that the change in voltage of the output line 207 is ΔVa (negative), and the output of the operation amplifier 119 is V(A), the following Expression (1) holds.

$$V(A) = Vref + \Delta Va \times (-C0/Cf) \tag{1}$$

Next, at T=t10, the driving pulse PISA is switched from a low level to a high level to turn on the switch 125. At T=t11, the driving pulse PISA is switched from a high level to a low level to turn off the switch 125. According to this operation, the signal is held at the holding capacitor 121.

Subsequently, at T=t12, the driving pulse PTXA is turned to a high level, and the driving pulse PTXB is turned to a high level during at least a part of the high-level period of the driving pulse PTXA. Thus, both of the first transfer transistor 103A and second transfer transistor 104A are turned on in parallel. According to this operation, the electric carriers of both of the photoelectric conversion units 101A and 102A may be transferred to the FD portion 110 at the same time. This operation enables the output line 207 to generate a signal for image formation. Note that the driving pulse PTXA and driving pulse PTXB may be changed from a low level to a high level at the same time. Alternatively, the driving pulse PTXA may be changed from a low level to a high level prior to the driving pulse PTXB. Alternatively, the driving pulse PTXA may be changed from a low level to a high level later than the driving pulse PTXB.

Until the electric carriers of both of the photoelectric conversion units 101A and 102A are transferred to the FD portion 110 in parallel after transferring the electric carrier of the photoelectric conversion unit 101A, the potential of the FD portion 110, that is, the potential of the input node of the amplifying transistor 201 is not reset. Specifically, until both of the first and second transfer transistors 103A and 104A are turned on after turning on the first transfer transistor 103A, the reset transistor 202 is kept off.

In the same way at the time of transferring only the electric carrier of the photoelectric conversion unit 101A, a signal based on the electric carrier transferred to the FD portion 110 is supplied to the column circuit 113. If we say that the change in voltage of the output line 207 is ΔVa+b (negative), and the output potential of the operation amplifier 119 is V(A+B), the following Expression (2) holds.

$$V(A+B) = Vref + \Delta Va + b \times (-C0/Cf) \tag{2}$$

At T=t14, the driving pulse PTSAB is switched from a low level to a high level to turn on the switch 122. Next, at T=t15, the driving pulse PTSAB is switched from a high level to a low level to turn off the switch 122. This operation enables the potential V(A+B) of the output node of the operation amplifier 119 to be written in the holding capacitor 123.

Thus, differential voltage between the capacitance CTSAB and CTN is obtained by the following Expression (3).

$$V(A+B) - Vref = \Delta Va + b \times (-C0/Cf) \tag{3}$$

This is equivalent to a result obtained by adding the signals of two photoelectric conversion units included in the pixel. A signal equivalent to one pixel at the time of performing imaging at the multiple photoelectric conversion units included in the pixel is obtained.

Also, potential difference between the holding capacitors 121 and 122 is obtained using the following Expression (4), whereby the signal of the first photoelectric conversion unit 101A alone may be obtained.

$$V(A) - Vref = \Delta Va \times (-C0/Cf) \tag{4}$$

A signal obtained by the first photoelectric conversion unit 101A is equivalent to information of a condensed light beam transmitting through a part of the pupil of the photographing lens. Further, potential difference of these is obtained by the following Expression (5), whereby the signal of the second photoelectric conversion unit 102A alone may be obtained.

$$(\Delta Va + b \times (-C0/Cf)) - (\Delta Va \times (-C0/Cf)) = \tag{5}$$
$$(\Delta Va + b - \Delta Va) \times (-C0/Cf))$$

The signal obtained by the second photoelectric conversion unit 102A is equivalent to information of a condensed light beam transmitted through another part of the pupil of the photographing lens. The multiple two photoelectric conversion units included in each pixel are disposed in a different position in a plane view. Also, focus detection may be performed from the information of the two light beams of the photoelectric conversion units 101A and 102A.

The above computation may be performed within the imaging apparatus, or may be performed by a signal processor after output from the imaging apparatus. However, the signal of the first photoelectric conversion unit 101A alone, and the signal after addition of the two photoelectric conversion units 101A and 102A are obtained within the imaging apparatus.

Next, at T=t16, the driving pulse PRES is turned to a high level, the reset transistor 202 is turned on, and the potential of the FD portion 110 is reset.

The signals held at the holding capacitors 121 to 124 are read out by the driving pulses 133 and 134 synchronized with the pulse PH being sequentially electrically conducted at T=t17 and thereafter. According to the present embodiment, since the output amplifier 115 capable of performing differential processing is provided to the following stage of the horizontal output lines 139 and 140, difference of signals held at the holding capacitors 121 and 122 may be output to the outside of the imaging apparatus. Further, difference of signals held at the holding capacitors 123 and 124 may be output to the outside of the imaging apparatus. Thus, noise generated at the horizontal output lines 139 and 140 may be reduced. However, the output amplifier 115 does not necessarily have a configuration for obtaining differential output, and may be a simple buffer stage. Hereinafter, the signals in each column are sequentially scanned by the horizontal scanning circuit 114, and are read out to the horizontal output lines 139 and 140.

Note that, though an example of the readout order has been described wherein after reading out the signal of the first photoelectric conversion unit 101A alone, the added signal of the first and second photoelectric conversion units 101A and 102A is read out, the order may be replaced. The signal of the first photoelectric conversion unit 101A alone is previously read out, whereby a more suitable signal is obtained. This is because the longer signals are held at the holding capacitors 121 to 124, the more readily influence of a leak current due to a capacitor and a switch is received.

The operation of the imaging apparatus illustrated in FIG. 1 has been descried above. The imaging apparatus illustrated in FIG. 2 also performs the same readout operation as with the driving timing illustrated in FIG. 4. The imaging apparatus illustrated in FIG. 2 may read out signals from the photoelectric conversion units 101A and 102A, and the signals from the photoelectric conversion units 101B and 102B as signals in different rows.

Specifically, after reading out the signal of the photoelectric conversion unit 101A, the first pixel 100A adds the electric carriers of the photoelectric conversion units 101A and 102A at the FD portion 110. Thus, both of a signal for focus detection amount and a signal for imaging can be generated. Next, after reading out the signal of the photoelectric conversion unit 101B, the second pixel 100B adds the electric carries of the photoelectric conversion units 101B and 102B at the FD portion 110. Thus, both of a signal for focus detection amount and a signal for imaging can be generated.

Also, in the case of the imaging apparatus illustrated in FIG. 2, the different two pixels share the amplifying transistor 201. Accordingly, the electric carriers of the photoelectric conversion units 101A and 101B may also be calculated at the FD portion 110, and the signals of the photoelectric conversion units 102A and 102B may also be added at the FD portion 110.

Figure 5:
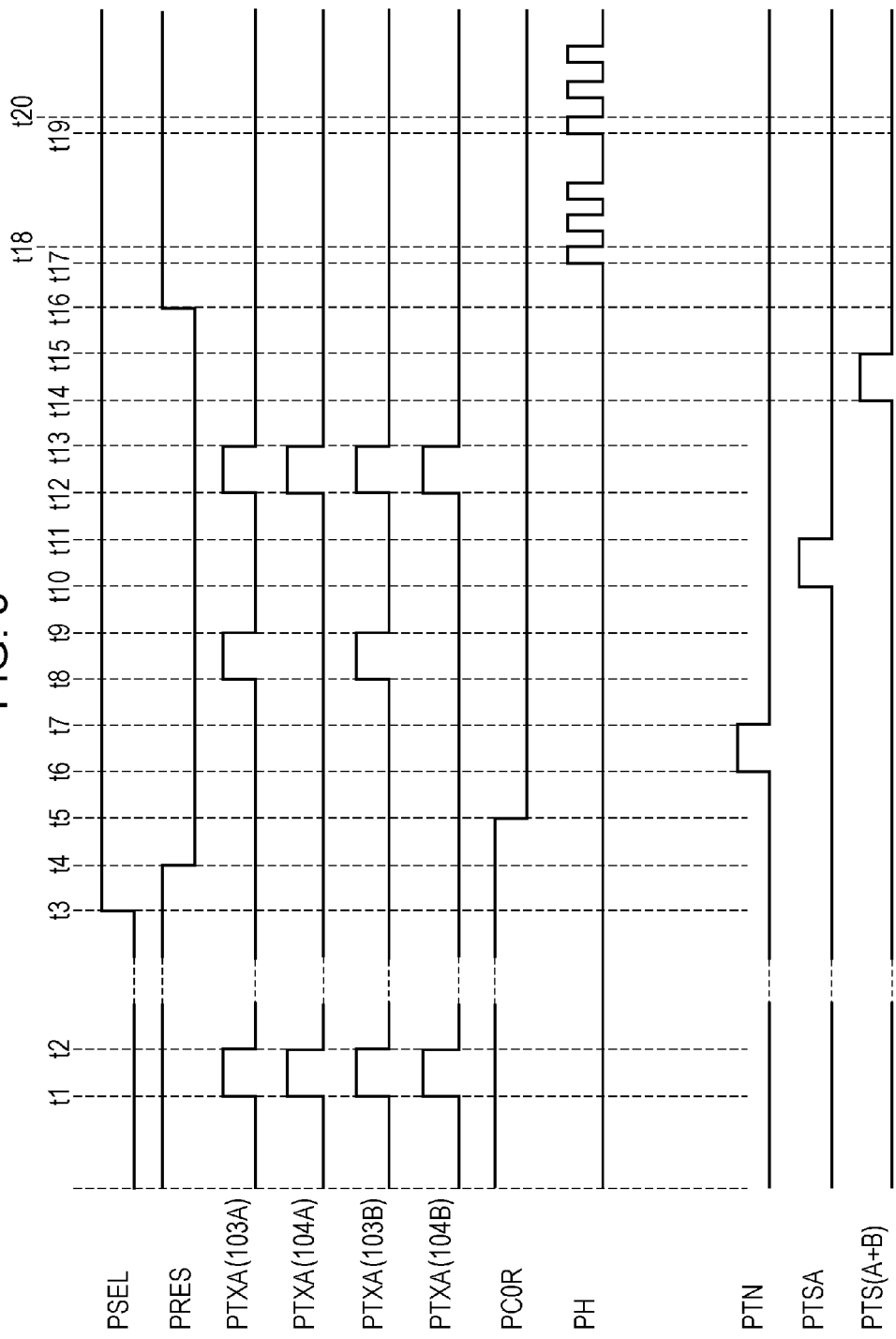
FIG. 5 is a diagram illustrating driving timing of the imaging apparatus.

An example of driving timing in the case of adding and reading the signals of two pixels will be illustrated in FIG. 5. Now, let us say that a driving pulse to be supplied to the transfer transistor 103A is taken as PTXA (103A), and a driving pulse to be supplied to the transfer transistor 104A is taken as PTXB (104A). Further, a driving pulse to be supplied to the transfer transistor 103B is taken as PTXA (103B), and a driving pulse to be supplied to the transfer transistor 104B is taken as PTXB (104B).

At time T=t8, the driving pulses PTXA (103A) and PTXA (103B) are turned from a low level to a high level. Thereafter, at time T=t9, the driving pulses PTXA (103A) and PTXA (103B) are turned from a high level to a low level. According to this operation, the electric carriers of the photoelectric conversion units 101A and 101B included in a different pixel are added at the FD portion 110. This signal is employed as a signal for focus detection.

Next, at time T=t12, the driving pulses PTXA (103A), PTXA (103B), PTXA (104A), and PTXB (104B) are turned from a low level to a high level. Thereafter, at time T=t13, the driving pulses PTXA (103A), PTXA (103B), PTXA (104A), and PTXB (104B) are turned from a high level to a low level. According to this operation, the electric carriers of all photoelectric conversion units 101A, 102A, 101B, and 102B included in a different pixel are added at the FD portion 110. This signal is employed as a signal for imaging.

According to the present operation, the signal for focus detection is obtained by adding the electric carriers of the multiple photoelectric conversion units included in a different pixel. Therefore, the S/N ratio can be improved. As a result thereof, focus detection with high precision is enabled.

The imaging apparatus according to the present embodiment can read out signals at high speed. This advantage will be described with reference to the drawings.

In general, when the potential of the gate of a transfer transistor changes from a level corresponding to off to a level corresponding to on, the potential of the FD portion may be changed due to capacitive coupling between a conductive member electrically connected to the gate of the transfer transistor and the FD portion. Therefore, readout of a signal based on the transferred electric carrier is performed after change in the potential of the FD portion sufficiently converges, that is, after the potential of the FD portion is stabilized, whereby signal precision can be improved. However, when change in the potential of the FD portion is great, it takes time until the potential of the FD portion is stabilized. Accordingly, it takes a longer time until an accurate signal is read out.

A signal based on the electric carrier of the first photoelectric conversion unit 101A of the two photoelectric conversion units is independently read out in the present embodiment. Therefore, of the two transfer transistors 103A and 104A, the first transfer transistor 103A is controlled from off to on while keeping the second transfer transistor 104A off. Thus, change of the potential of the FD portion 110 can be reduced. As a result thereof, a period from transfer of an electric carrier to signal readout can be reduced, and the signal can be read out at high speed.

Figure 6:
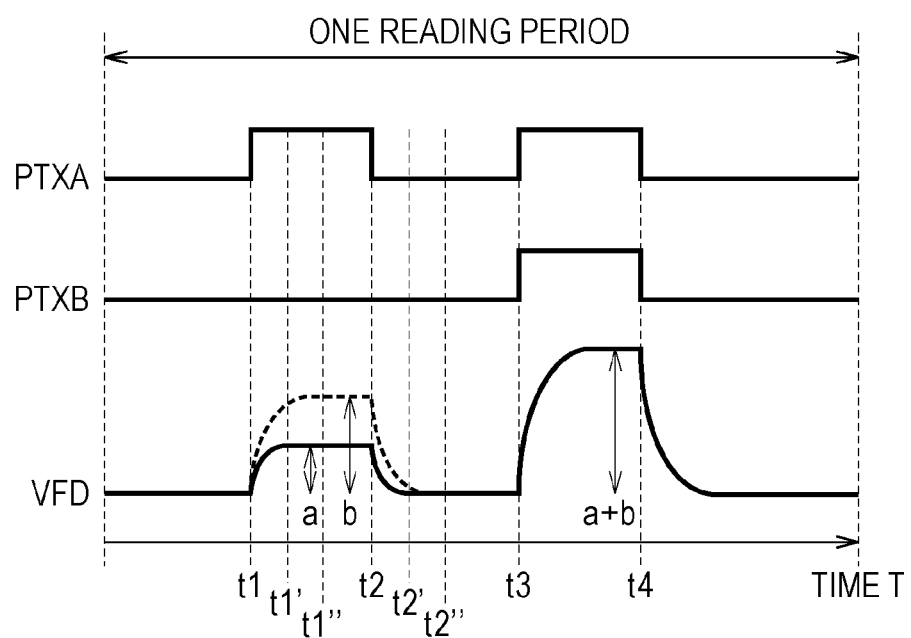
FIG. 6 is a diagram for describing an advantage of the imaging apparatus.

FIG. 6 is a diagram schematically illustrating change of the potential of the FD portion 110 during a reading period in the imaging apparatus according to the present embodiment. Let us say that a driving pulse to be supplied to the driving line 211A of the first transfer transistor 103A is taken as PTXA, and a driving pulse to be supplied to the driving line 212A of the second transfer transistor 104A is taken as PTXB. Also, the potential of the FD portion 110 is represented by VFD. A solid line indicates change in the potential of the FD portion 110 according to the present embodiment, and a dotted line indicates change in the potential of the FD portion according to a comparative example. Note that the time T=t1, T=t2, T=t3, and T=t4 in FIG. 6 correspond to the time T=t8, T=t9, T=t12, and T=t13 in FIGS. 4 and 5, respectively.

At time T=t1 in FIG. 6, the driving pulse PTXA is turned from a low level to a high level. This operation causes the electric carrier accumulated in the photoelectric conversion unit 101A to be read out to the FD portion 110. This signal is employed as a signal for focus detection, for example. Let us say that the amount of change in the potential of the FD portion 110 at this time is taken as a, and the amount of change in the potential of the FD portion in the case of turning the driving pulse PTXB alone from a low level to a high level is taken as b, which is illustrated by a dotted line.

The first conductive member 105A electrically connected to the gate electrode of the first transfer transistor 103A is disposed farther from the FD portion 110 than the second conductive member 106A electrically connected to the gate electrode of the second transfer transistor 104A in the present embodiment. Therefore, the capacitive components between the first conductive member 105A and FD portion 110 are smaller than the capacitive components between the second conductive member 106A and FD portion 110. Accordingly, change in the potential of the FD portion 110 when the first transfer transistor 103A turns on is smaller than change in the potential of the FD portion 110 when the second transfer transistor 104A turns on. Specifically, a<b holds.

Therefore, time taken until the potential of the FD portion 110 is stabilized as to change of the potential due to application of the driving pulses is t1 to t1' when the driving pulse PTXA alone changes, and is t1 to t1" when the driving pulse PTXB alone changes. As illustrated in FIG. 6, since the periods t1 to t1' is shorter than the periods t1 to t1", a signal can be read out earlier. That is to say, the period taken for the entirety of signal read operation can be reduced. Similarly, when turning the PTXA from a high level to a low level at the time T=t2 as well, the period until the potential of the FD portion 110 is stabilized can be reduced.

Further, the present embodiment includes the following secondary advantages. Japanese Patent Laid-Open No. 2001-124984 discloses the following operation. A signal of a first photoelectric conversion unit is written in a holding capacitor, horizontal transfer operation is performed to read out the signal to the outside of an imaging apparatus. Next, a reset transistor performs reset operation. Thereafter, a signal of a second photoelectric conversion unit is written in a holding capacitor, horizontal transfer operation is performed, and the signal is read out to the outside of a sensor. The reset transistor performs reset operation again.

In this case, reading period difference (several tens to several hundred microseconds) equivalent to one row occurs between readout of the signal of the first photoelectric conversion unit and readout of the signal of the second photoelectric conversion unit.

In the case of the present embodiment, first, the signal of the first photoelectric conversion unit 101A is written in the holding capacitor at T=t11. Next, while holding the electric carrier transferred from the photoelectric conversion unit 101A at the FD portion 110, the electric carriers of both of the photoelectric conversion units 101A and 102A are transferred at T=t12. Thus, the reading period is significantly reduced (several microseconds). Further, signal reading time period difference between the two photoelectric conversion units 101A and 102A is reduced, which provides an advantage for improving accuracy of focus detection.

Also, turning both of the driving pulses PTXA and PTXB to a high level in parallel enables the following advantage to be obtained.

In general, the potential of the FD portion 110 is increased by capacitive coupling between the driving line of the transfer transistor and the FD portion 110 when the potential of the gate of a transfer transistor changes from a low level to a high level. The potentials of the gates of the two transfer transistors 103A and 104A are changed from a low level to a high level in the present embodiment. Accordingly, the increased amount of the potential of the FD portion 110 increases more than a case where only one transfer transistor is turned on. Upon the potential of the FD portion 110 increasing, the electric carriers of the photoelectric conversion units 101A and 102A are readily transferred to the FD portion 110. Accordingly, transfer efficiency can be improved. Note that advantages of this improved transfer efficiency can be obtained if at least two transfer transistors are on in parallel. The two transfer transistors are turned on at the same time, whereby transfer efficiency can further be improved.

In particular, in the same way as with the present embodiment, in the case of the imaging apparatus in which the one pixel 100 for imaging is configured of the two photoelectric conversion units 101A and 102A, a potential barrier may frequently be provided between the two photoelectric conversion units 101A and 102A. This potential barrier complicates the potential distribution of the photoelectric conversion units. Accordingly, electric carrier remaining at the time of transfer readily occurs, and fixed pattern noise or random noise may occur. On the other hand, the driving pulses PTXA and PTXB are turned to a high level at the same time, which enables electric carriers to be transferred in a state in which the potential of the FD portion 110 is high, and provides an advantage for reducing fixed pattern noise and random noise.

Additionally, difference between the accumulation periods of the two photoelectric conversion units 101A and 102A can be reduced. In the case of the configuration of Japanese Patent Laid-Open No. 2001-124984, the accumulation periods in the two photoelectric conversion units are shifted. On the other hand, in the case of the present embodiment, at the time of adding electric carries at the FD portion 110, timing for turning off each of multiple transfer transistors corresponding to a photoelectric conversion unit configured to perform addition is set to generally the same. Thus, the accumulation periods can be aligned. This is particularly effective for a configuration for obtaining a signal for focus detection at the image sensing surface of the imaging apparatus.

Second Embodiment

Now, another embodiment will be described. Difference with the first embodiment is in that a third conductive member 701 is provided between the first conductive member 105A and the FD portion 110. Therefore, only points different from the first embodiment will be described, and description of portions similar to the first embodiment will be omitted.

Figure 7:
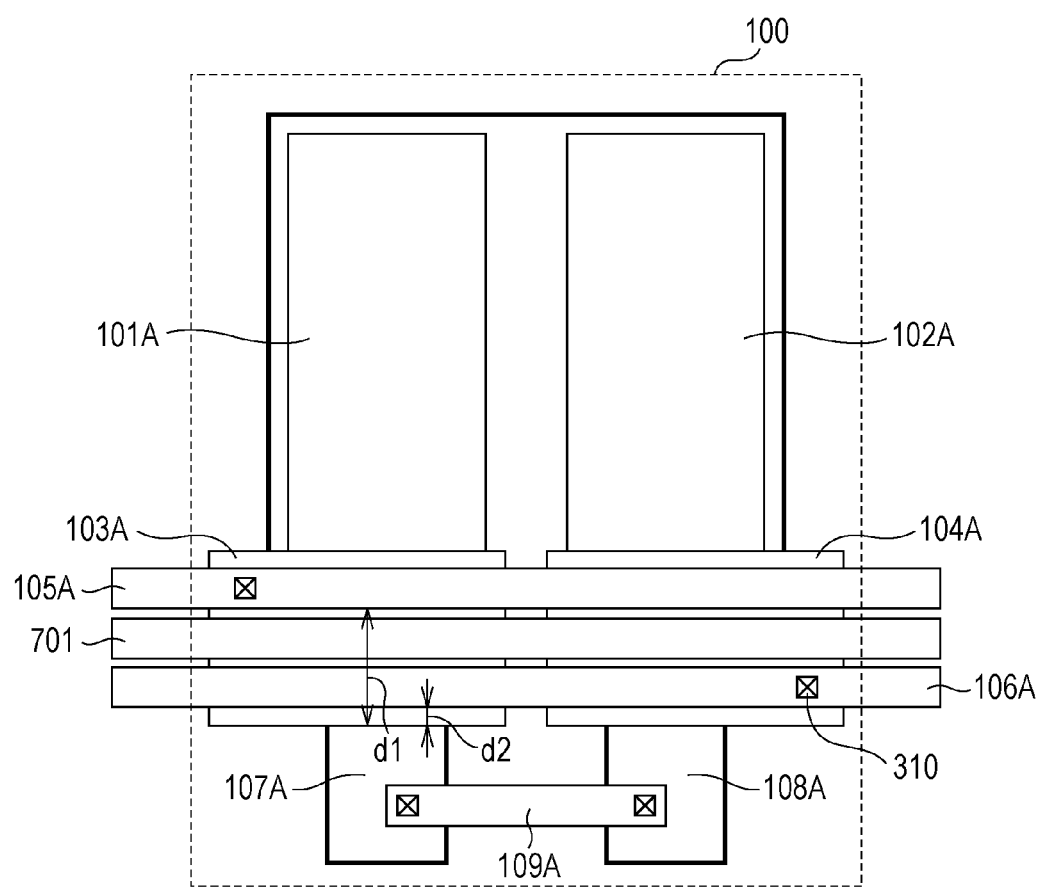
FIG. 7 is a diagram schematically illustrating a planar structure of an imaging apparatus.

FIG. 7 is a diagram schematically illustrating a planar structure of an imaging apparatus according to the present embodiment. Portions having the same functions as those in FIG. 3 are denoted with the same reference numerals. As illustrated in FIG. 7, the third conductive member 701 is disposed between the first conductive member 105A and the FD portion 110. Specifically, the first conductive member 105A, third conductive member 701, and the conductive member 109A included in the FD portion 110 are disposed on the same wiring layer, and the third conductive member 701 is positioned between the first conductive member 105A and the conductive member 109A.

An arrangement may be made wherein the third conductive member 701 is electrically connected to the gate electrode of a transistor, and makes up the driving line of this transistor. Alternatively, the third conductive member 701 may be a power supply line or GND line. Alternatively, the third conductive member 701 may be electrically floating.

Alternatively, the third conductive member 701 may be disposed between at least a part of the first conductive member 105A and at least a part of the conductive member 109A. It goes without saying that the third conductive member 701 may be disposed between the entirety of the first conductive member 105A and the entirety of the conductive member 109A.

The first conductive member 105A, conductive member 109A, and third conductive member 701 are disposed on the same wiring layer in the present embodiment. However, one of these may be disposed on a different wiring layer. Alternatively, the third conductive member 701 may be disposed between the second conductive member 106A and the conductive member 109A.

The following advantage is obtained in the present embodiment in addition to the advantages of the first embodiment. Providing the third conductive member 701 enables the capacitive components between the first conductive member 105A and the FD portion 110 to be reduced. Accordingly, change in the potential of the FD portion 110 when the first transfer transistor changes to on from off can be reduced. As a result thereof, readout of signals can be performed at high speed.

Third Embodiment

Now, another embodiment will be described. Difference with the first embodiment is in that the electric carrier of the first photoelectric conversion unit 101A, and the electric carrier of the second photoelectric conversion unit 102A are transferred to the same semiconductor region 801. Therefore, only points different from the first embodiment will be described, and description of portions similar to the first embodiment will be omitted.

Figure 8:
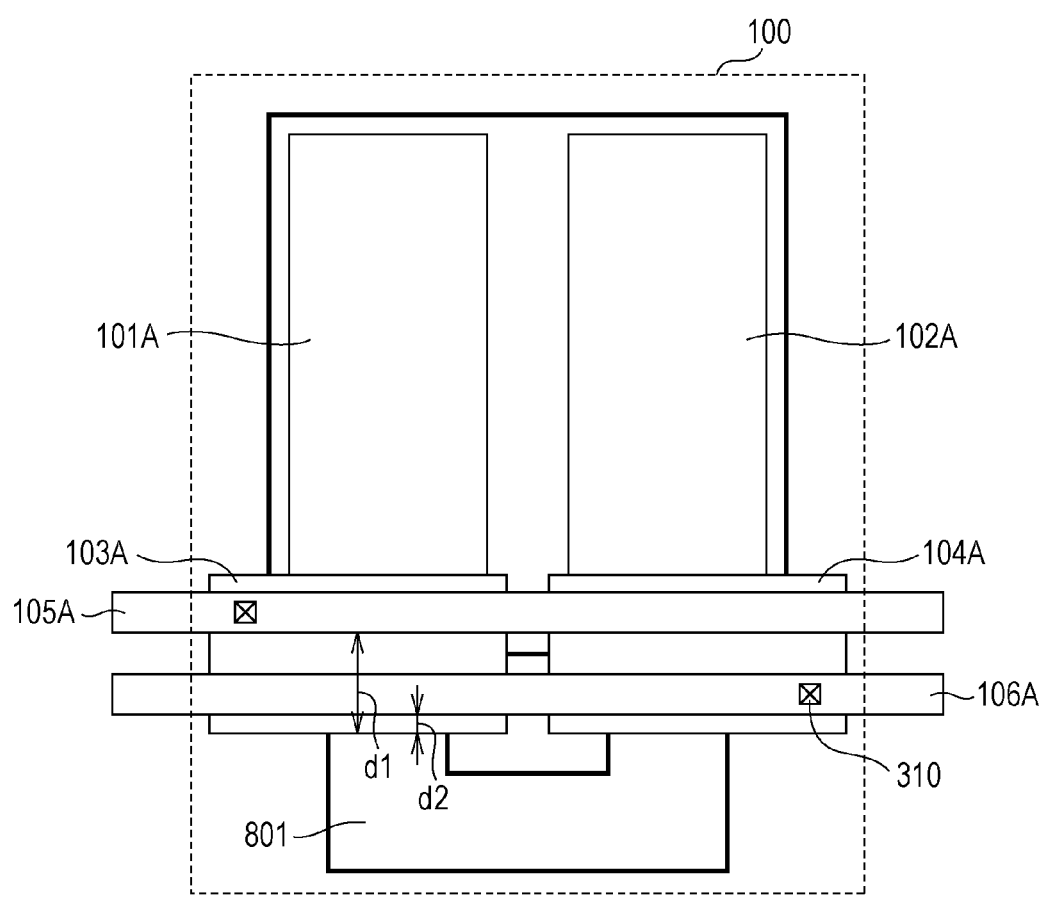
FIG. 8 is a diagram schematically illustrating a planar structure of an imaging apparatus.

FIG. 8 is a diagram schematically illustrating a planar structure of an imaging apparatus according to the present embodiment. Portions having the same functions as those in FIG. 3 are denoted with the same reference numerals. As illustrated in FIG. 8, the two photoelectric conversion units 101A and 102A are electrically connected to the semiconductor region 801 via the gate electrodes 103A and 104B of the corresponding transfer transistors, respectively. That is to say, the FD portion 110 is configured of the one semiconductor region 801.

Note that the semiconductor region 801 may electrically be connected to the input node of an amplifying transistor by a conductive member which is not illustrated. Alternatively, the semiconductor region 801 may be configured of a control node such as a bipolar transistor or JFET or the like.

The following advantage is obtained in the present embodiment in addition to the advantages in the first embodiment. The FD portion 110 is configured of the one semiconductor region 801. Thus, the capacitance of the FD portion 110 can be reduced. Accordingly, charge-voltage conversion efficiency at the FD portion 110 can be improved.

Fourth Embodiment

Now, another embodiment will be described. Difference with the first embodiment is in that the layout of pixels differs from the layout of pixels in the first embodiment. Therefore, only points different from the first embodiment will be described, and description of portions similar to the first embodiment will be omitted.

Figure 9:
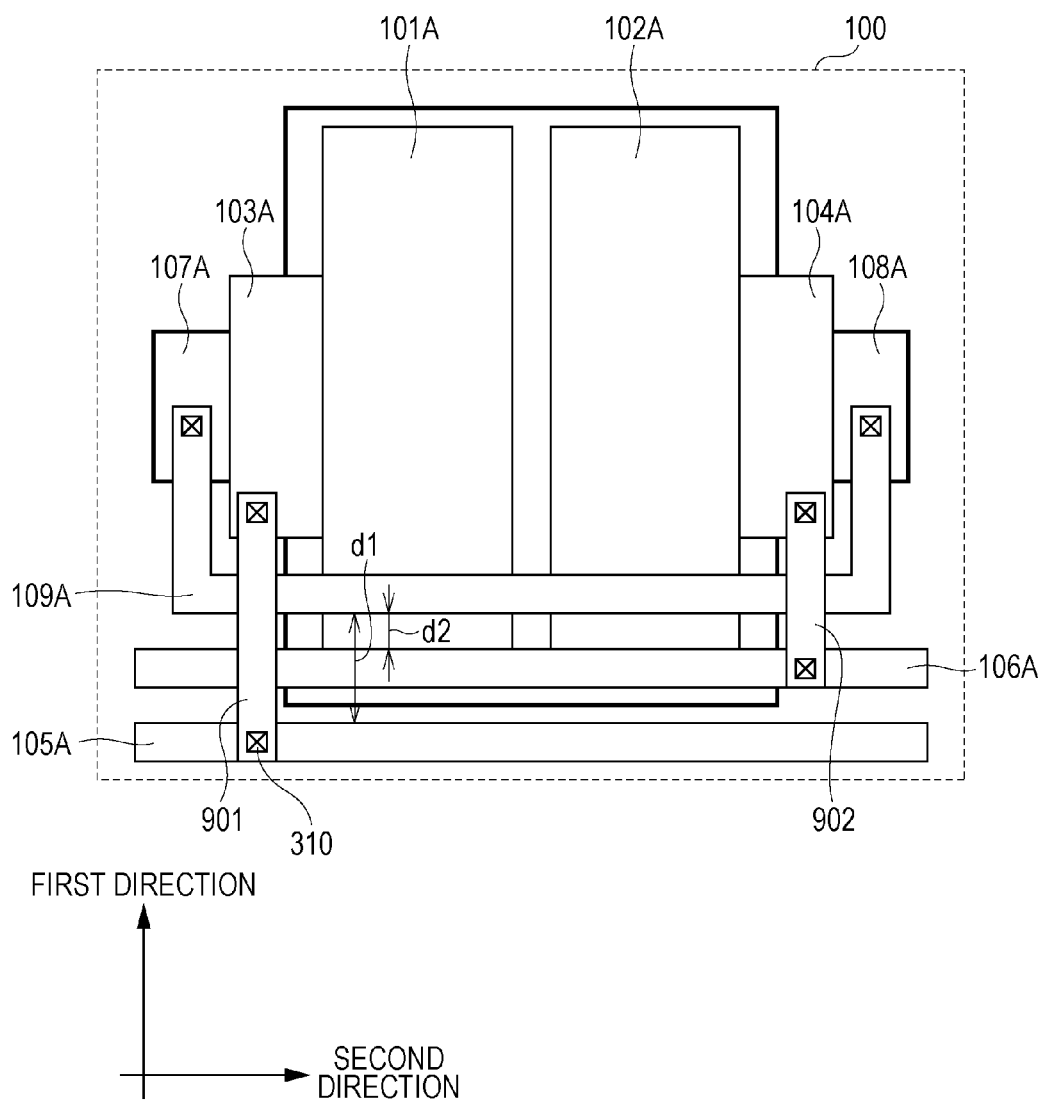
FIG. 9 is a diagram schematically illustrating a planar structure of an imaging apparatus.

FIG. 9 is a diagram schematically illustrating a planar structure of an imaging apparatus according to the present embodiment. Portions having the same functions as those in FIG. 3 are denoted with the same reference numerals. As illustrated in FIG. 9, in the case of the present embodiment, the first photoelectric conversion unit 101A, the gate electrode of the first transfer transistor 103A, and the FD region 107A are arrayed in the second direction. Also, the first conductive member 105A electrically connected to the gate electrode 103A extends in the second direction. Also, the second photoelectric conversion unit 102A, the gate electrode of the second transfer transistor 104A, and the FD region 108A are arrayed in the second direction. The second conductive member 106A electrically connected to the gate electrode 104A extends in the second direction.

The gate electrode 103A and first conductive member 105A are electrically connected via a conductive member 901. The gate electrode 104A and second conductive member 106A are electrically connected via a conductive member 902. The conductive members 105A, 106A, and 109A are disposed on a first wiring layer. The conductive members 901 and 902 are disposed on a second wiring layer above the first wiring layer.

In order to improve mirror symmetry, the two FD regions 107A and 108A are disposed so that a photoelectric conversion unit is disposed between both, in the present embodiment. Accordingly, the conductive member 109A included in the FD portion 110 is apt to lengthen. Such a layout further distinguishes the advantage of the first embodiment since the distance d1 between the first conductive member 105A and FD portion 110 is longer than the distance d2 between the second conductive member 106A and FD portion 110. Specifically, the present embodiment has a great advantage for accelerating readout speed of signals.

Note that in the present embodiment, since the distance between the first wiring layer and second wiring layer is relatively long, the first conductive member 105A is closer to the FD portion 110, more specifically, to the conductive member 109A of the FD portion 110, than the conductive members 901 connected to the gate electrode 103A is close to the FD portion 110. Similarly, of the conductive members connected to the gate electrode 104A, the second conductive member 106A is disposed to be closest to the FD portion 110, more specifically, to the conductive member 109A.

In the modification of this embodiment, the conductive members 901 and 902 may be closest to the FD portion 110 because the distance between the first wiring layer and second wiring layer is relatively short. However, the conductive members 901 and 902 extend in a direction crossing the conductive member 109A included in the FD portion 110. Therefore, of the capacitance of the FD portion 110, capacitive components according to the conductive members 901 and 902 are small. Accordingly, the capacitive components as to the FD portion 110 are significantly changed depending on the layout of the conductive members 105A and 106A extending in the same direction as with the conductive member 109A of the FD portion 110.

Fifth Embodiment

Now, another embodiment will be described. Difference with the first embodiment is in that the layout of pixels differs from the layout of pixels in the first embodiment. Therefore, only points different from the first embodiment will be described, and description of portions similar to the first embodiment will be omitted.

Figure 10:
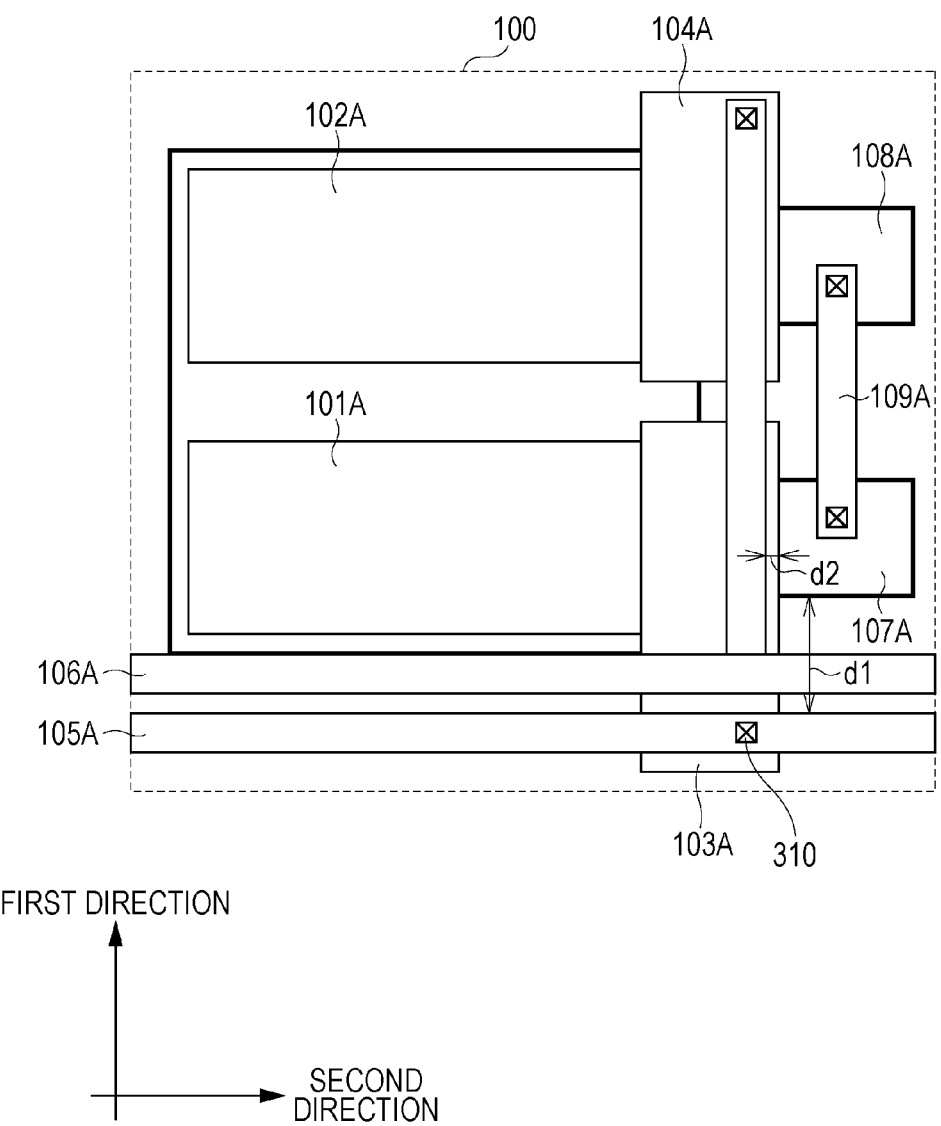
FIG. 10 is a diagram schematically illustrating a planar structure of an imaging apparatus.

FIG. 10 is a diagram schematically illustrating a planar structure of an imaging apparatus according to the present embodiment. Portions having the same functions as those in FIG. 3 are denoted with the same reference numerals. As illustrated in FIG. 10, in the case of the present embodiment, the first photoelectric conversion unit 101A, the gate electrode of the first transfer transistor 103A, and the FD region 107A are arrayed in the second direction. Also, the first conductive member 105A electrically connected to the gate electrode 103A extends in the second direction. Also, the second photoelectric conversion unit 102A, the gate electrode of the second transfer transistor 104A, and the FD region 108A are arrayed in the second direction. The second conductive member 106A electrically connected to the gate electrode 104A extends in the second direction.

The conductive members 105A, 106A, and 109A are disposed on the same wiring layer. Therefore, the same advantage as with the first embodiment may be yielded without restricting flexibility of the layout of other wiring layers.

Sixth Embodiment

Figure 11:
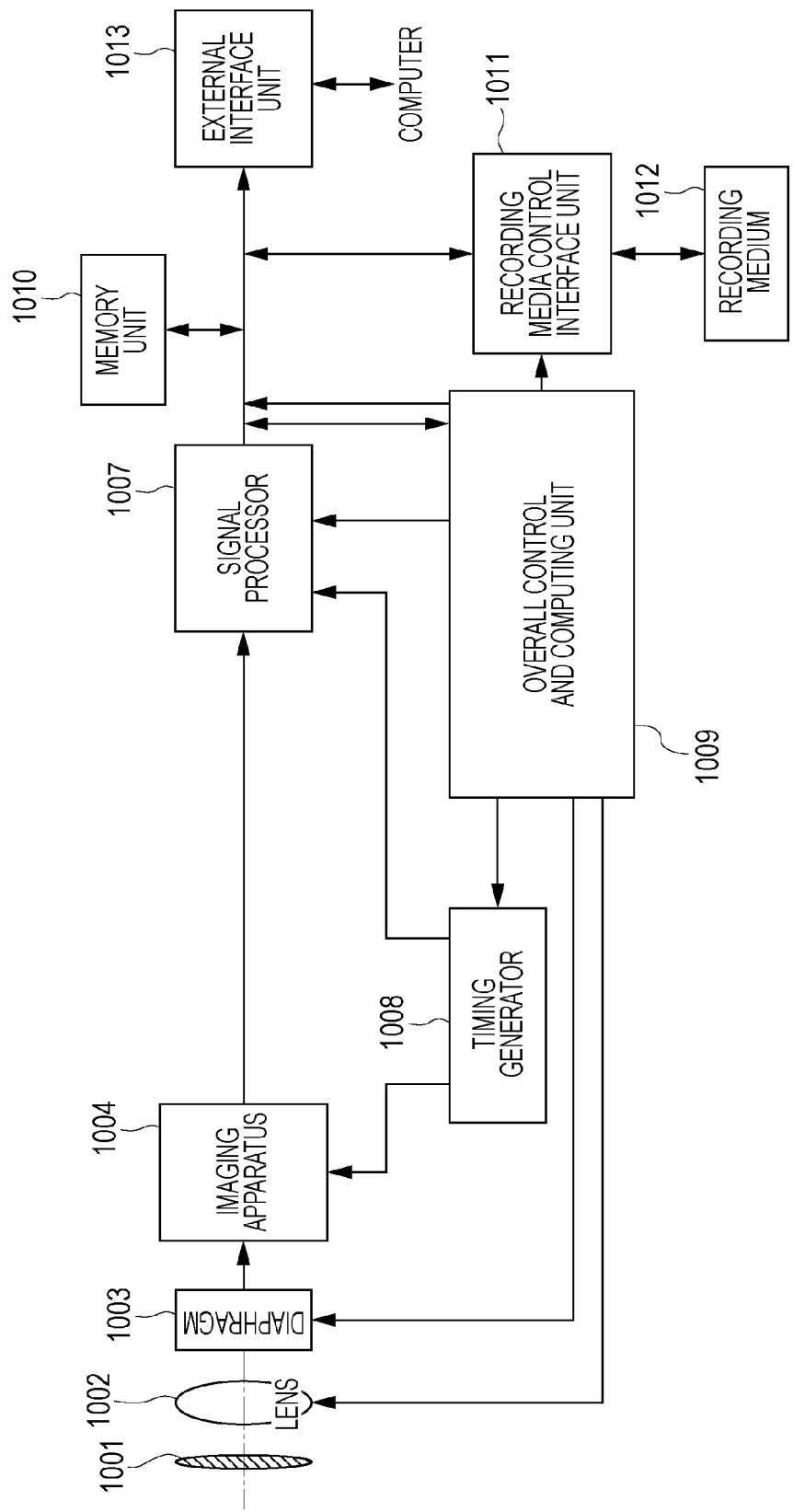
FIG. 11 is a block diagram of an imaging system according to an embodiment of the invention.

An imaging system according to an embodiment of the present invention will be described. Examples of the imaging system include digital still cameras, digital camcorders, copiers, facsimiles, mobile phones, in-vehicle cameras, and orbiting satellites. FIG. 11 illustrates a block diagram of a digital still camera serving as an example of the imaging system.

In FIG. 11, a reference numeral 1001 denotes a barrier for lens protection, 1002 denotes a lens causing the imaging apparatus 1004 to perform focusing on an optical image of a photographic subject, and 1003 denotes a diaphragm configured to change the amount of light passing through the lens 1002. A reference numeral 1004 denotes an imaging apparatus described in the above embodiments, and is configured to convert the optical image formed by the lens 1002 as image data. Now, let us say that an AD conversion unit is formed on a semiconductor substrate of the imaging apparatus 1004. A reference numeral 1007 denotes a signal processor configured to subject imaged data output by the imaging apparatus 1004 to various types of correction or to compress the imaged data. In FIG. 11, a reference numeral 1008 denotes a timing generator configured to output various types of timing signals to the imaging apparatus 1004 and signal processor 1007, and 1009 denotes an overall control unit configured to control the entire digital still camera. A reference numeral 1010 denotes a frame memory unit configured to temporarily store image data, 1011 denotes an interface unit configured to perform recording or readout on a recording medium, and 1012 denotes a recoding medium capable of connecting to and disconnecting from the imaging apparatus 1004, such as semiconductor memory or the like, configured to preform recording or readout of imaged data. Also, a reference numeral 1013 denotes an interface unit configured to communicate with an external computer or the like. Here, a timing signal or the like may be input from the outside of the imaging system. The imaging system has to include at least the imaging apparatus 1004, and the signal processor 1007 configured to process the imaged signal output from the imaging apparatus 1004.

A configuration has been described in the present embodiment wherein the imaging apparatus 1004 and AD conversion unit are provided to a different semiconductor substrate. However, the imaging apparatus 1004 and AD conversion unit may be formed on the same semiconductor substrate. Also, the imaging apparatus 1004 and signal processor 1007 may be formed on the same semiconductor substrate.

Also, the signal processor 1007 may be configured to process a signal based on an electric carrier generated at the first photoelectric conversion unit 101A, and a signal based on an electric carrier generated at the second photoelectric conversion unit 102A to obtain distance information from the imaging apparatus 1004 to a subject.

The imaging apparatus according to the first embodiment or second embodiment is employed as the imaging apparatus 1004 in the imaging system according to the present embodiment. Thus, readout of signals can be performed at high speed by applying an embodiment of the present invention to an imaging system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-093885 filed Apr. 26, 2013, which is hereby incorporated by reference herein in its entirety.

What is claimed is:

1. An imaging apparatus comprising:
    a pixel including at least a first photoelectric conversion unit, a second photoelectric conversion unit, a floating diffusion portion, a first transfer transistor configured to transfer an electric carrier generated at the first photoelectric conversion unit to the floating diffusion portion, and a second transfer transistor configured to transfer an electric carrier generated at the second photoelectric conversion unit to the floating diffusion portion;
    a first conductive member electrically connected to a gate electrode of the first transfer transistor;
    a second conductive member electrically connected to a gate electrode of the second transfer transistor; and
    a control unit electrically connected to the first transfer transistor and the second transfer transistor via the first conductive member and the second conductive member respectively;
    wherein a distance of closest proximity between the first conductive member and the floating diffusion portion is longer than a distance of closest proximity between the second conductive member and the floating diffusion portion; and
    wherein the control unit is configured to perform:
    a first control operation for setting from a state in which both of the first transfer transistor and the second transfer transistor are off, a state where the first transistor is on while keeping the second transfer transistor off, and
    a second control operation for setting a state in which both of the first transfer transistor and the second transfer transistor are on while the electric carrier transferred by the first control operation is held at the floating diffusion portion.

2. The imaging apparatus according to claim 1, wherein the floating diffusion portion includes
    a semiconductor region disposed in a semiconductor substrate and configured to hold a transferred electric carrier, and
    a third conductive member electrically connected to the semiconductor region.

3. The imaging apparatus according to claim 2, wherein the semiconductor region includes
    a first semiconductor region disposed correspondingly to the first photoelectric conversion unit, and
    a second semiconductor region disposed correspondingly to the second photoelectric conversion unit; and
    wherein the third conductive member electrically connects the first semiconductor region and the second semiconductor region mutually.

4. The imaging apparatus according to claim 3, wherein the first photoelectric conversion unit, the gate electrode of the first transfer transistor, and the first semiconductor region are arrayed in a first direction;
    wherein the second photoelectric conversion unit, the gate electrode of the second transfer transistor, and the second semiconductor region are arrayed in the first direction; and
    wherein each of the first conductive member and the second conductive member extends in a second direction intersecting the first direction.

5. The imaging apparatus according to claim 3, wherein the first photoelectric conversion unit, the gate electrode of the first transfer transistor, and the first semiconductor region are arrayed in a first direction;
    wherein the second photoelectric conversion unit, the gate electrode of the second transfer transistor, and the second semiconductor region are arrayed in the first direction; and
    wherein each of the first conductive member and the second conductive member extends in a direction parallel to the first direction.

6. The imaging apparatus according to claim 2, wherein at least a part of an orthogonal projection of the second conductive member onto a plane parallel to a surface of the first photoelectric conversion unit is positioned in a region between an orthogonal projection of the first conductive member onto the plane, and an orthogonal projection of the semiconductor region included in the floating diffusion portion onto the plane.

7. The imaging apparatus according to claim 1, wherein at least a part of an orthogonal projection of the gate electrode of the first transfer transistor onto a plane parallel to a surface of the first photoelectric conversion unit is superimposed on each of an orthogonal projection of the second conductive member onto the plane, and an orthogonal projection of the first conductive member onto the plane; and wherein at least a part of an orthogonal projection of the gate electrode of the second transfer transistor onto the plane is superimposed on each of the orthogonal projection of the second conductive member, and the orthogonal projection of the first conductive member.

8. The imaging apparatus according to claim 1, wherein the control unit is configured, between the first control operation and the second control operation, to set a state in which the first transfer transistor and the second transfer transistor are off.

9. The imaging apparatus according to claim 1, the pixels further including:
an amplifying portion configured to output a signal based on an electric carrier of the floating diffusion portion, wherein the amplifying portion is configured to output a first signal based on an electric carrier generated at the first photoelectric conversion unit during a period from a start of the first control operation to a start of the second control operation, and to output, after the second control operation is started, a second signal based on an electric carrier added at the floating diffusion portion.

10. The imaging apparatus according to claim 1, wherein a capacitive coupling between the first conductive member and the floating diffusion portion is less than a capacitive coupling between the second conductive member and the floating diffusion portion.

11. The imaging apparatus according to claim 1, wherein a change in a potential of the floating diffusion portion caused by a change in a potential of the first conductive member is smaller than a change in the potential of the floating diffusion portion caused by a corresponding change in a potential of the second conductive member.

12. The imaging apparatus according to claim 1, further comprising:
a fourth conductive member disposed between at least a part of the first conductive member and the floating diffusion portion.

13. The imaging apparatus according to claim 1, wherein a material of the gate electrode differs from a material of the first conductive member and the second conductive member.

14. The imaging apparatus according to claim 1, wherein the first conductive member and the second conductive member are electrically connected respectively to the gate electrode of the first transfer transistor and the gate electrode of the second transfer transistor via contact plugs.

15. An imaging apparatus comprising:
a pixel including at least a first photoelectric conversion unit, a second photoelectric conversion unit, a floating diffusion portion, a first transfer transistor configured to transfer an electric carrier generated at the first photoelectric conversion unit to the floating diffusion portion, and a second transfer transistor configured to transfer an electric carrier generated at the second photoelectric conversion unit to the floating diffusion portion;
a first conductive member electrically connected to a gate electrode of the first transfer transistor;
a second conductive member electrically connected to a gate electrode of the second transfer transistor; and
a control unit electrically connected to the first transfer transistor and the second transfer transistor via the first conductive member and the second conductive member respectively;
wherein the first conductive member and the second conductive member are disposed in a same wiring layer;
wherein, in a plane parallel to a surface of the first photoelectric conversion unit, at least a part of an orthogonal projection of the second conductive member onto the plane is positioned in a region between an orthogonal projection of the first conductive member onto the plane, and an orthogonal projection of the floating diffusion portion onto the plane; and
wherein the control unit is configured to perform:
a first control operation for setting from a state in which both of the first transfer transistor and the second transfer transistor are off, a state where the first transistor is on, while keeping the second transfer transistor off, and
a second control operation for setting a state in which both the first transfer transistor and the second transfer transistor are on while the electric carrier transferred by the first control operation is held at the floating diffusion portion.

16. The imaging apparatus according to claim 15, wherein the floating diffusion portion includes a semiconductor region; and
wherein at least the part of the orthogonal projection of the second conductive member is positioned in a region between the orthogonal projection of the first conductive member and an orthogonal projection of the semiconductor region included in the floating diffusion portion onto the plane.

17. An imaging apparatus comprising:
a pixel including at least a first photoelectric conversion unit, a second photoelectric conversion unit, a floating diffusion portion, a first transfer transistor configured to transfer an electric carrier generated at the first photoelectric conversion unit to the floating diffusion portion, and a second transfer transistor configured to transfer an electric carrier generated at the second photoelectric conversion unit to the floating diffusion portion;
a first conductive member electrically connected to a gate electrode of the first transfer transistor;
a second conductive member electrically connected to a gate electrode of the second transfer transistor; and
a control unit electrically connected to the first transfer transistor and the second transfer transistor via the first conductive member and the second conductive member respectively;
wherein the first conductive member and the second conductive member are disposed in a same wiring layer;
wherein the floating diffusion portion includes a third conductive member disposed in the wiring layer;
wherein at least a part of the second conductive member is positioned between the first conductive member and the third conductive member included in the floating diffusion portion; and
wherein the control unit is configured to perform:
a first control operation for setting from a state in which both of the first transfer transistor and the second transfer transistor are off, a state where the first transistor is on, while keeping the second transfer transistor off, and
a second control operation for setting a state in which both of the first transfer transistor and the second transfer transistor are on while the electric carrier transferred by the first control operation is held at the floating diffusion portion.

18. An imaging apparatus comprising:
a pixel including at least a first photoelectric conversion unit, a second photoelectric conversion unit, a floating diffusion portion, a first transfer transistor configured to transfer an electric carrier generated at the first photoelectric conversion unit to the floating diffusion portion, and a second transfer transistor configured to transfer an electric carrier generated at the second photoelectric conversion unit to the floating diffusion portion;
a first conductive member electrically connected to a gate electrode of the first transfer transistor;
a second conductive member electrically connected to a gate electrode of the second transfer transistor; and
a control unit electrically connected to the first transfer transistor and the second transfer transistor via the first conductive member and the second conductive member respectively;
wherein a change in a potential of the floating diffusion portion caused by a change in a potential of the first conductive member is smaller than a change in the potential of the floating diffusion portion caused by a corresponding change in a potential of the second conductive member; and
wherein the control unit is configured to perform:
a first control operation for setting from a state in which both of the first transfer transistor and the second transfer transistor are off, a state where the first transistor is on, while keeping the second transfer transistor off, and
a second control operation for setting a state in which both of the first transfer transistor and the second transfer transistor are on while the electric carrier transferred by the first control operation is held at the floating diffusion portion.

19. An imaging apparatus comprising:
a pixel including at least a first photoelectric conversion unit, a second photoelectric conversion unit, a floating diffusion portion, a first transfer transistor configured to transfer an electric carrier generated at the first photoelectric conversion unit to the floating diffusion portion, and a second transfer transistor configured to transfer an electric carrier generated at the second photoelectric conversion unit to the floating diffusion portion;
a first conductive member electrically connected to a gate electrode of the first transfer transistor;
a second conductive member electrically connected to a gate electrode of the second transfer transistor; and
a control unit electrically connected to the first transfer transistor and the second transfer transistor via the first conductive member and the second conductive member respectively;
wherein a capacitive coupling between the first conductive member and the floating diffusion portion is less than a capacitive coupling between the second conductive member and the floating diffusion portion; and
wherein the control unit is configured to perform:
a first control operation for setting, from a state in which both of the first transfer transistor and the second transfer transistor are off, a state where the first transistor is on, while keeping the second transfer transistor off, and
a second control operation for setting a state in which both of the first transfer transistor and the second transfer transistor are on while the electric carrier transferred by the first control operation is held at the floating diffusion portion.

20. An imaging apparatus comprising:
a pixel including at least a first photoelectric conversion unit, a second photoelectric conversion unit, a floating diffusion portion, a first transfer transistor configured to transfer an electric carrier generated at the first photoelectric conversion unit to the floating diffusion portion, and a second transfer transistor configured to transfer an electric carrier generated at the second photoelectric conversion unit to the floating diffusion portion;
a lens disposed corresponding to the pixel;
a first conductive member electrically connected to a gate electrode of the first transfer transistor; and
a second conductive member electrically connected to a gate electrode of the second transfer transistor;
wherein the first photoelectric conversion unit and the second photoelectric conversion unit are disposed so as to receive light passing through mutually different positions of a pupil of the lens, thereby outputting a signal for focus detection from the first photoelectric conversion unit; and
wherein a distance of closest proximity between the first conductive member and the floating diffusion portion is longer than a distance of closest proximity between the second conductive member and the floating diffusion portion.

21. An imaging system comprising:
the imaging apparatus according to claim 1; and
a signal processing device configured to process a signal from the imaging apparatus;
wherein the signal processing device is configured to process a signal based on an electric carrier generated at the first photoelectric conversion unit output from the imaging apparatus, and a signal based on an electric carrier generated at the second photoelectric conversion unit, and acquires distance information from the imaging apparatus to an object.

* * * * *